(12) United States Patent
Colombo et al.

(10) Patent No.: US 6,900,673 B2
(45) Date of Patent: May 31, 2005

(54) MICROCONTROLLER UNIT

(75) Inventors: Joseph G. Colombo, Lodi, NJ (US); Igor Y. Gofman, Croton-on-Hudson, NY (US)

(73) Assignee: Coltene/Whaledent, Inc., Cuyahoga Falls, OH (US)

( * ) Notice: Subject to any disclaimer, the term of this patent is extended or adjusted under 35 U.S.C. 154(b) by 0 days.

(21) Appl. No.: 10/161,773

(22) Filed: Jun. 4, 2002

(65) Prior Publication Data

US 2003/0222685 A1 Dec. 4, 2003

(51) Int. Cl.[7] .............................................. H03B 19/00
(52) U.S. Cl. ......................................... 327/114; 377/31
(58) Field of Search ............................... 327/113, 114, 327/291, 299, 295; 377/52, 26, 31

(56) References Cited

U.S. PATENT DOCUMENTS

| | | | | |
|---|---|---|---|---|
| 3,937,932 A | * | 2/1976 | Ahlgren | ........................ 377/52 |
| 3,992,679 A | | 11/1976 | Isono | |
| 4,012,647 A | | 3/1977 | Balamuth et al. | |
| 4,814,967 A | * | 3/1989 | Broughton et al. | ......... 363/160 |
| 5,059,122 A | | 10/1991 | Hetzel | |
| 5,379,724 A | | 1/1995 | Dee et al. | |
| 5,451,161 A | | 9/1995 | Sharp | |
| 5,634,939 A | | 6/1997 | Kuster et al. | |
| 5,658,322 A | | 8/1997 | Fleming | |
| 5,730,394 A | | 3/1998 | Cotton et al. | |
| 5,805,909 A | * | 9/1998 | Diewald | ..................... 713/322 |
| 5,927,977 A | | 7/1999 | Sale et al. | |
| 5,938,677 A | | 8/1999 | Boukhny et al. | |
| 6,019,775 A | | 2/2000 | Sakurai | |
| 6,144,139 A | | 11/2000 | Noma et al. | |
| 6,175,280 B1 | * | 1/2001 | Lloyd et al. | ................. 331/1 R |
| 6,190,167 B1 | | 2/2001 | Sharp | |

FOREIGN PATENT DOCUMENTS

| | | |
|---|---|---|
| DE | 2 011 299 | 9/1972 |
| DE | 24 59 841 | 7/1976 |
| DE | 29 29 646 | 2/1981 |
| DE | 31 36 028 | 3/1983 |

* cited by examiner

Primary Examiner—Timothy P. Callahan
Assistant Examiner—Cassandra Cox
(74) Attorney, Agent, or Firm—Katten Muchin Zavis Rosenman

(57) ABSTRACT

A micro-controller adjustably provides a scanning frequency for operating a driver for an ultrasonic device. The frequency is adjusted within a defined range until an acknowledgement signal is provided to the micro-controller to lock a currently selected frequency as the operating frequency. An indicator indicates when a frequency has been selected outside of the defined range. The device is preferably implemented as a complex programmable logic device (CPLD).

21 Claims, 1 Drawing Sheet

Microcontroller. Functional Diagram

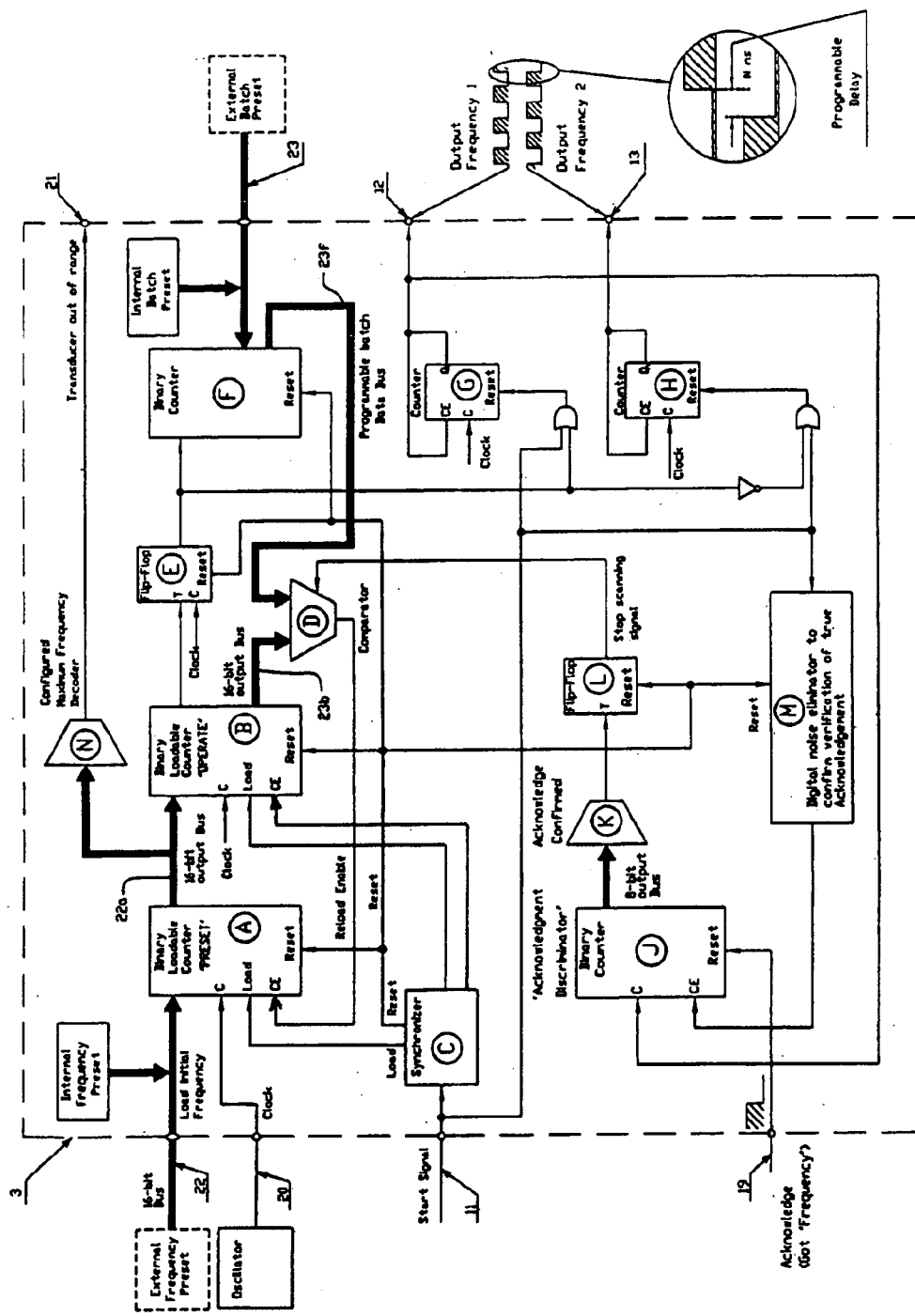
Fig. 1 Microcontroller. Functional Diagram

US 6,900,673 B2

MICROCONTROLLER UNIT

CROSS REFERENCE TO RELATED APPLICATION

The present application is related to Ser. No. 10/161,790, entitled "Ultrasonic Driver," filed concurrently with the present application on Jun. 4, 2002 by inventors common to the present application, and which is hereby incorporated by reference.

FIELD OF THE INVENTION

The present invention relates generally to the field of controllers. More specifically, the invention relates to a microcontroller for providing a pre-defined sequence of output frequencies, and upon the occurrence of a recognizable condition, locking a corresponding output frequency for continuing operation.

BACKGROUND OF THE INVENTION

Electrical oscillators have a wide variety of applications in the prior art. One application, for example, relates to driving ultrasonic devices such as piezo-electric transducers. Such devices may be used in a host of applications including, for example, dental scalers.

It may be useful to operate such an oscillator in a "scanning mode", in which a frequency of oscillation is periodically changed by a known amount in order to evaluate the performance of the driven device at various operating frequencies. Piezo-electric transducers, for example, operate most efficiently at a resonant frequency at which a current flow through the transducer may be observed to be at a maximum. Accordingly, it would be desirable to have a controller capable of providing scanning frequencies over a defined range, and of "locking in" a corresponding frequency of operation upon receiving an indication that a maximum performance level has been reached.

As transducers are being developed at an increasingly smaller scale, it would further be desirable to have such a controller occupy a small physical space.

SUMMARY OF THE INVENTION

A micro-controller according to the principles of the present invention includes a first circuit for outputting a signal representative of an operating frequency, a second circuit for receiving the output signal and completing a counting operation related to the operating frequency, and a third circuit for outputting a pulse at the completion of the counting operation. At the completion of a counting operation by the second circuit and until an acknowledgement signal has been received, the first circuit outputs a next signal representing a next operating frequency, causing the second circuit to complete a next counting operation and the third circuit to output a next pulse, so that a stream of pulses with varying frequencies are output by the third circuit. While no acknowledgment signal is received, operating frequency may be adjusted with each counting operation by the second circuit, or may alternatively repeat for a predetermined number of counting cycles ("batches"). Upon receipt of an acknowledgment signal indicating a desired performance condition, the micro-controller locks the first circuit so that the stream of pulses continues at an operating frequency corresponding to the desired performance condition.

In a preferred embodiment of the present invention, the micro-controller further comprises a circuit for determining when a next frequency is outside a predetermined range, and for generating an out-of-range signal upon determining that the next frequency is out of range. In a second preferred embodiment of the present invention, the micro-controller separately outputs two sequences of pulses, such that a first one of the sequences is out of phase with a second one of the sequences, and the beginning of a pulse in each sequence is delayed by a known amount of delay from the completion of a pulse in the other sequence. In a third preferred embodiment of the present invention, a noise elimination circuit is employed at the beginning of an operation cycle to reduce the likelihood of receiving a false acknowledgement signal at the beginning of the cycle.

The micro-controller may be implemented in a compact and integrated form, for example as a complex programmable logic device (CPLD).

BRIEF DESCRIPTION OF THE DRAWING

A more complete understanding of the invention may be obtained by reading the following description of specific illustrative embodiments of the invention in conjunction with the appended drawing in which:

FIG. 1 provides a schematic diagram for an embodiment of the present invention.

DESCRIPTION OF THE PREFERRED EMBODIMENTS

While this invention is illustrated and described in a preferred embodiment, the device may be produced in many different configurations, forms and materials. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

In accordance with the principles of the present invention, FIG. 1 presents a functional diagram for micro-controller 3. Micro-controller 3 may advantageously be implemented as a complex programmable logic device (CPLD), available for example from Cypress Semiconductor of San Jose, Calif.

Micro-controller 3 includes a variety of synchronous circuits A–H and J–N that are driven by an oscillator via clock signal 20. Synchronous circuits A, B, F, G, H and J may be implemented, for example, as standard binary counters.

Counter A is a preset counter that stores a number representative of a desired starting scan frequency for micro-controller 3. The representative number may be provided to the counter A either from an internal preset (fixed value) or an external preset (user-selectable value) over programmable frequency divider data bus 22. A user-selectable value may be supplied, for example, via a dedicated or multiplexed computer data bus. The following example illustrates the operation of counter A.

An operating frequency $f_{osc}$ of clock signal 20 is established for micro-controller 3. For example, $f_{osc}$ may be preferably set to 100 megahertz (Mhz), or any other suitable value. A starting frequency preset is provided as a digital number $D_n$ over programmable frequency divider data bus 22. If bus 22 is, for example, a 16 bit bus, the digital number $D_n$ may range from 1 to 65,535. Counter A is loaded with the preset number over bus 22 when start signal 11 triggers synchronizer C to load counter A.

After a period of time suitable for counter A to receive the digital number $D_n$, synchronizer C triggers counter B to load the digital number D, received from counter A over bus 22a. Counter B decrements the digital number $D_n$ at clock rate $f_{osc}$. Accordingly, counter B is able to complete a decrementing cycle in cycle time $T_{cycle}$, where:

$$T_{cycle} = D_n / f_{osc} \quad [1]$$

When counter B completes its decrementing count, it triggers flip-flop E, which in turn, for example, supplies a logical "1" to counter F and to a reset of counter G, and through an inverter supplies a logical "0" to a reset of counter H. This causes counter G to provide a pulse on output 12, and causes counter H to terminate a pulse on output 13. When counter B completes a next decrementing count, it again triggers flip-flop E, which then supplies a logical "0" to counter F and to a reset of counter G, and through an inverter supplies a logical "1" to a reset of counter H. This causes counter G to terminate a pulse on output 12, and causes counter H to provide a pulse on output 13. As each frequency cycle requires two countdown periods (in order, for example, to produce both a first half cycle when a pulse is active and a second half cycle when a pulse is inactive), $D_n$ is determined as a function of $f_{osc}$ and a desired starting frequency $f_{start}$ by the following equation:

$$D_n = f_{osc} / (2 * f_{start}) \quad [2]$$

Counter G and counter H are configured with a predetermined delay on their outputs. This delay contributes to a separation of "On and Off" time between outputs 12 and 13 as they operate alternately to each other (for example, a separation of N nanoseconds is shown in an inset of FIG. 1). This separation may provide an advantage, for example, when micro-controller 3 is used in conjunction with typical push-pull or bridge output drivers where current switching noise could be elevated by simultaneously operating more than one driver transistor in an "On" state.

With receipt of a next logical "0" from flip-flop E, counter G output switches to a logical "0", and after the predetermined delay, Counter H output switches to a logical "1". The predetermined delay may be set, for example, at 200 nanoseconds.

After counter A loads digital number $D_n$ in counter B over its output bus 22a, it prepares a next digital number $D_{next}$ for delivery to counter B over bus 22a. $D_{next}$ is typically incremented or decremented by a predetermined amount from $D_n$. Accordingly, counter B is loaded to begin a next countdown period in cycle time $T_{next}$, where:

$$T_{next} = D_{next} / f_{osc} \quad [3]$$

Alternatively, a batch preset value may be supplied over bus 23, either from an internally stored preset (fixed value) or an externally supplied preset (user-selectable value) at bus 23. An externally supplied value may be obtained, for example, from a dedicated or multiplexed computer data bus. The batch preset value represents a number of the countdown periods for which counter B will continue counting down from a selected digital number $D_c$ before moving to the next digital number $D_{next}$. For example, if the batch preset value is set to 8, counters G, H are caused to output pulses for 8 periods at a constant output frequency as counter A maintains the digital number $D_c$ on output bus 22a for 8 consecutive cycles by counter B. This feature may be useful when using micro-controller 3 in conjunction with an ultrasonic transducer that requires operation at a constant frequency for a number of cycles in order for transducer performance to stabilize (for example, as may be true for magnetostrictive transducers).

On its output bus 23b, counter B provides an output at the completion of each countdown period made by counter B with reference to currently selected digital number $D_c$. Counter F provides comparator D with a batch preset value supplied over bus 23f. When the batch preset number is greater than zero, comparator D blocks the output on bus 23b from triggering a reload enable of counter A to provide a next digital number $D_{next}$ for loading into counter B. When counter B completes a number of countdown periods from currently selected digital number $D_c$ that is equal to the batch preset number, comparator D allows the output on bus 23b to trigger counter A. When the batch preset number is set to zero, no blocking occurs at comparator D, and each completed countdown period by counter B triggers an output from comparator D that causes counter A to produce and load counter B with a next digital number $D_{next}$.

Micro-controller 3 continues to supply a scanning frequency until signaled that a desired operating, frequency has been reached. Acknowledge signal 19 is supplied externally to micro-controller 3 when the desired operating frequency is reached (for example, at a frequency causing a maximum current flow through the transducer). Acknowledge signal 19 activates counter J to cause confirmation circuit K to trigger flip-flop L to send a stop scanning signal to comparator D. Confirmation circuit K monitors the output bus of counter J. When the output of counter J remains stable for a predetermined number of output cycles (for example, ten output cycles), confirmation circuit K triggers flip flop L to send a stop scanning signal to comparator D. Upon receiving the stop scanning signal, comparator D disables counter A from changing currently selected digital number $D_c$. Accordingly, counter A continues to load counter B with currently selected digital number $D_c$, and signals having, a "locked" frequency $f_{locked}$ are produced at outputs 12, 13. As a pulse (for example on output 12 of FIG. 1) is produced in each of every two consecutive countdown periods, locked frequency $f_{locked}$ may be determined according to the following formula:

$$f_{locked} = f_{osc} / (2 * D_c) \quad [4]$$

Near the time that operation of micro-controller 3 is initiated by start signal 11, it is possible that a false acknowledge signal 19 could terminate the scanning frequency operation of micro-controller 3. In order to avoid this possibility, digital noise eliminator M controls operation of counter J at initiation. While start signal 11 has not been provided, eliminator M disables counter J. After start signal 11 is provided, eliminator counts several time periods (for example, totaling on the order of a few milliseconds) before enabling counter J.

Accordingly, and consistent with principles of the present invention, micro-controller 3 operates to alter its output frequency over a pre-selected range until a desired operating frequency is selected via acknowledge signal 19. In the event that acknowledge signal 19 is not received and an associated limit is reached at a digital number $D_{limit}$, maximum frequency decoder N detects $D_{limit}$ on bus 22a and provides a transducer-out-of-range signal 21. For example, when counter A is configured to decrement the digital number, decoder N operates to output out of range signal 21 when the output at each bit position of bus 22a is a logical "0". Alternatively, when counter A is configured to increment the digital number, decoder N operates to output out of range signal 21 when the output at each bit position of bus 22a is a logical "1". Out of range signal 21 may be advantageously supplied, for example, to an indicator such as an LED indicating circuit or the like.

It should be noted that the micro-controller 3 may be arranged to scan so that operating frequency either increments or decrements from starting frequency $S_f$.

A system and method has been shown in the above embodiments for the effective implementation of a micro-controller unit. While various preferred embodiments have been shown aid described, it will be understood that there is no intent to limit the invention by such disclosure, but rather, it is intended to cover all modifications and alternate constructions falling within the spirit and scope of the invention, as defined in the appended claims.

We claim:

1. A micro-controller device for providing a first stream of pulses at an adjustable frequency, said device comprising:
   a first circuit for outputting a number representing a currently selected frequency;
   a second circuit for receiving said number and completing a counting operation during a time period representative of the currently selected frequency; and
   a third circuit for outputting a pulse at the completion of the counting operation by the second circuit;
   wherein, at the completion of each counting operation by the second circuit and until an acknowledgement signal is received, the first circuit outputs a next number representing a next frequency differing by a predetermined amount from the currently selected frequency, for causing the second circuit to complete a next counting operation during a time period representative of the next frequency and for causing the third circuit to output a next pulse, thereby producing the first pulse stream having successive pulses each at a frequency differing from a preceding pulse by the predetermined amount, and wherein at the completion of a counting operation by the second circuit and after the acknowledgement signal is received, the first circuit is restricted to output a next number at the currently selected frequency only, causing the second circuit to complete a next counting operation during a time period representative of the currently selected frequency and the third circuit to output a next pulse, thereby producing a pulse stream at the currently selected frequency.

2. The device according to claim 1, further comprising a fifth circuit for causing the second circuit to complete N counting operations during N time periods representative of the currently selected frequency, wherein N is determined in accordance with a batch preset number.

3. The device according to claim 1, wherein a frequency preset is changeably provided at an input to the first circuit for determining a first number to be output by the first circuit.

4. The device according to claim 1, comprising a seventh circuit for processing the acknowledgement signal.

5. A micro-controller device for providing a first stream of pulses at an adjustable frequency, said device comprising:
   a first circuit for outputting a number representing a currently selected frequency;
   a second circuit for receiving said number and completing a counting operation during a time period representative of the currently selected frequency;
   a third circuit for outputting a pulse at the completion of the counting operation by the second circuit,
   wherein at the completion of each counting operation by the second circuit and until an acknowledgement signal is received, the first circuit outputs a next number representing a next frequency, for causing the second circuit to complete a next counting operation during a time period representative of the next frequency and for causing the third circuit to output a next pulse, thereby producing the first pulse stream; and
   a fourth circuit for outputting a second pulse stream, wherein the second pulse stream is out of phase with respect to the first pulse stream.

6. The device according to claim 5, wherein a beginning of an output pulse in the first pulse stream is delayed from an ending of an output pulse in the second pulse stream.

7. The device according to claim 6, wherein the delay is approximately 200 nanoseconds.

8. A micro-controller device for providing a first stream of pulses at an adjustable frequency, said device comprising:
   a first circuit for outputting a number representing a currently selected frequency;
   a second circuit for receiving said number and completing a counting operation during a time period representative of the currently selected frequency;
   a third circuit for outputting a pulse at the completion of the counting operation by the second circuit,
   wherein, at the completion of each counting operation by the second circuit and until an acknowledgement signal is received, the first circuit outputs a next number representing a next frequency, for causing the second circuit to complete a next counting operation during a time period representative of the next frequency and for causing the third circuit to output a next pulse, thereby producing the first pulse stream; and
   a fifth circuit for causing the second circuit to complete N counting operations during N time periods representative of the currently selected frequency, wherein N is determined in accordance with a batch preset number; wherein the batch preset number is unchangeably stored by the device.

9. A micro-controller device for providing a first stream of pulses at an adjustable frequency, said device comprising:
   a first circuit for outputting a number representing a currently selected frequency;
   a second circuit for receiving said number and completing a counting operation during a time period representative of the currently selected frequency;
   a third circuit for outputting a pulse at the completion of the counting operation by the second circuit,
   wherein, at the completion of each counting operation by the second circuit and until an acknowledgement signal is received, the first circuit outputs a next number representing a next frequency, for causing the second circuit to complete a next counting operation during a time period representative of the next frequency and for causing the third circuit to output a next pulse, thereby producing the first pulse stream; and
   a fifth circuit for causing the second circuit to complete N counting operations during N time periods representative of the currently selected frequency, wherein N is determined in accordance with a batch preset number, wherein the batch preset number is changeably provided at an input to the fifth circuit.

10. A micro-controller device for providing a first stream of pulses at an adjustable frequency, said device comprising:
    a first circuit for outputting a number representing a currently selected frequency;
    a second circuit for receiving said number and completing a counting operation during a time period representative of the currently selected frequency; and a third circuit for outputting a pulse at the completion of the counting operation by the second circuit;

wherein, at the completion of each counting operation by the second circuit and until an acknowledgement signal is received, the first circuit outputs a next number representing a next frequency, for causing the second circuit to complete a next counting operation during a time period representative of the next frequency and for causing the third circuit to output a next pulse, thereby producing the first pulse stream, and wherein a frequency preset is unchangeably stored by the device and input to the first circuit for determining a first number to be output by the first circuit.

11. A micro-controller device for providing a first stream of pulses at an adjustable frequency, said device comprising:

a first circuit for outputting a number representing a currently selected frequency;

a second circuit for receiving said number and completing a counting operation during a time period representative of the currently selected frequency;

a third circuit for outputting a pulse at the completion of the counting operation by the second circuit, wherein, at the completion of each counting operation by the second circuit and until an acknowledgement signal is received, the first circuit outputs a next number representing a next frequency, for causing the second circuit to complete a next counting operation during a time period representative of the next frequency and for causing the third circuit to output a next pulse, thereby producing the first pulse stream; and a sixth circuit for determining when the next number is outside a predetermined range of acceptable numbers, and for generating an out-of-range signal when the next number is outside said predetermined range.

12. A micro-controller device for providing a first stream of pulses at an adjustable frequency, said device comprising:

a first circuit for outputting a number representing a currently selected frequency;

a second circuit for receiving said number and completing a counting operation during a time period representative of the currently selected frequency;

a third circuit for outputting a pulse at the completion of the counting operation by the second circuit;

wherein, at the completion of each counting operation by the second circuit and until an acknowledgement signal is received, the first circuit outputs a next number representing a next frequency, for causing the second circuit to complete a next counting operation during a time period representative of the next frequency and for causing the third circuit to output a next pulse, thereby producing the first pulse stream; and a seventh circuit for processing the acknowledgement signal, wherein the seventh circuit comprises a noise eliminator for eliminating false acknowledgement signals.

13. A micro-controller device for providing a first stream of pulses at an adjustable frequency, said device comprising:

a first circuit for outputting a number representing a currently selected frequency;

a second circuit for receiving said number and completing a counting operation during a time period representative of the currently selected frequency;

a third circuit for outputting a pulse at the completion of the counting operation by the second circuit;

wherein, at the completion of each counting operation by the second circuit and until an acknowledgement signal is received, the first circuit outputs a next number representing a next frequency, for causing the second circuit to complete a next counting operation during a time period representative of the next frequency and for causing the third circuit to output a next pulse, thereby producing the first pulse stream; and an eighth circuit for initiating operation of the device upon receipt of a start signal.

14. The device according to claim 13, wherein the eighth circuit synchronizes operation of the first and second circuits.

15. A method for providing a first stream of pulses at an adjustable frequency, the method comprising the steps of:

outputting a current number representing a currently selected frequency;

receiving said number and completing a counting operation during a time period representative of the currently selected frequency; and outputting a pulse at the completion of the counting operation;

wherein, at the completion of each counting operation and until an acknowledgement signal is received, a next number representing a next frequency differing by a predetermined amount from the currently selected frequency is output to cause a counting operation to complete during a time period representative of the next frequency and a next pulse to be output, thereby producing the first pulse stream having successive pulses each at a frequency differing from a preceding pulse by the predetermined amount, and wherein at the completion of a counting operation and after the acknowledgement signal is received, the next number is restricted to represent the currently selected frequency only, causing a next counting operation to complete during a time period representative of the currently selected frequency and a next pulse to be output, thereby producing a pulse stream at the currently selected frequency.

16. The method of claim 15, further comprising the step of repeating the counting and outputting steps until N working operations are completed and N pulses are output during N time periods representative of the currently selected frequency, wherein N is determined in accordance with a batch preset number.

17. A method for providing a first stream of pulses at an adjustable frequency, the method comprising the steps of:

outputting a current number representing a currently selected frequency;

receiving said number and completing a counting operation during a time period representative of the currently selected frequency;

outputting a pulse at the completion of the counting operation, wherein, at the completion of each counting operation and until an acknowledgement signal is received, a next number representing a next frequency is output to cause a counting operation to complete during a time period representative of the next frequency and a next pulse to be output, thereby producing the first pulse stream; and outputting a second pulse stream, wherein the second pulse stream is out of phase with respect to the first pulse stream.

18. The method of claim 17, wherein a beginning of a pulse in one of the first and second pulse streams is delayed by a predetermined amount from an ending of a pulse in the other pulse stream.

19. The method of claim 18, wherein the delay is approximately 200 nanoseconds.

20. A method for providing a first stream of pulses at an adjustable frequency, the method comprising the steps of:

outputting a current number representing a currently selected frequency;

receiving said number and completing a counting operation during a time period representative of the currently selected frequency;

outputting a pulse at the completion of the counting operation;

wherein, at the completion of each counting operation and until an acknowledgement signal is received, a next number representing a next frequency is output to cause a counting operation to complete during a time period representative of the next frequency and a next pulse to be output, thereby producing the first pulse stream;

determining whether the next frequency is outside a predetermined range of frequencies; and generating an out-of range signal when the next frequency is outside said range.

21. A method for providing a first stream of pulses at an adjustable frequency, the method comprising the steps of:

completing a counting operation during a time period representative of a currently selected frequency; and outputting a pulse at the completion of the counting operation;

wherein, at the completion of each counting operation and until an acknowledgement signal is received, a next counting operation is completed during a time period representative of a next frequency differing by a predetermined amount from the currently selected frequency, and a next pulse is output at the completion of the next counting operation, thereby producing the first pulse stream having successive pulses each at a frequency differing from a preceding pulse by the predetermined amount, and wherein at the completion of a counting operation and after the acknowledgement signal is received, the next number is restricted to represent the currently selected frequency only, causing a next counting operation to complete during a time period representative of the currently selected frequency and a next pulse to be output, thereby producing a pulse stream at the currently selected frequency.

* * * * *